United States Patent [19]

Schamber et al.

[11] Patent Number: 5,376,792

[45] Date of Patent: Dec. 27, 1994

[54] SCANNING ELECTRON MICROSCOPE

[75] Inventors: Frederick H. Schamber, Murrysville; Raymond E. Turocy, Bridgeville, both of Pa.

[73] Assignee: RJ Lee Group, Inc., Monroeville, Pa.

[21] Appl. No.: 52,654

[22] Filed: Apr. 26, 1993

[51] Int. Cl.$^5$ .............................................. H01J 37/26
[52] U.S. Cl. ................... 250/311; 250/396 R; 250/396 ML
[58] Field of Search ............ 250/396 ML, 396 R, 311

[56] References Cited

U.S. PATENT DOCUMENTS

| | | | |
|---|---|---|---|
| 2,319,061 | 5/1943 | Hillier | 250/160 |
| 2,378,962 | 6/1945 | Washburn | 73/18 |
| 2,422,041 | 6/1947 | Ramo | 250/49.5 |
| 2,424,790 | 7/1947 | Bachman et al. | 250/49.5 |
| 2,450,462 | 10/1948 | Washburn | 250/41.9 |
| 3,787,696 | 1/1974 | Dao et al. | 250/311 |
| 3,857,055 | 12/1974 | Shirai et al. | 313/237 |
| 3,873,831 | 3/1975 | Ruska et al. | 250/306 |
| 3,916,201 | 10/1975 | Herrmann et al. | 250/396 ML |
| 3,927,321 | 12/1975 | Welter | 250/311 |
| 4,041,311 | 8/1977 | Martin | 250/311 |
| 4,041,316 | 8/1977 | Todokoro et al. | 250/396 R |
| 4,798,957 | 1/1989 | Tolner | 250/396 R |
| 4,823,006 | 4/1989 | Danilatos et al. | 250/310 |
| 5,103,094 | 4/1992 | Hayes et al. | 250/306 |

OTHER PUBLICATIONS

Reference-BS343 Minisem, Mar. 7, 1991.

*Primary Examiner*—Jack I. Berman
*Attorney, Agent, or Firm*—Webb Ziesenheim Bruening Logsdon Orkin & Hanson

[57] ABSTRACT

An improved scanning electron microscope is disclosed which includes a compact, replaceable electron beam emitter assembly and concentric liner tubes. The concentric liner tubes extend through a central portion of electromagnetic lenses for forming an evacuated path for the electron beam. An outer sealing jacket is provided for forming a vacuum seal with the column assembly sufficient to maintain a vacuum within the outer sealing jacket. A conductive inner liner tube positioned within the outer sealing jacket is adapted to have the electron beam pass therethrough. The inner liner tube provides supports for spray baffles and/or beam shaping orifices. The improved electron beam emitter assembly within the gun assembly includes a filament clamped between a front plate and a back plate by clamping screws. The clamping screws additionally hold an adjustable grid against the front plate.

24 Claims, 2 Drawing Sheets

SCANNING ELECTRON MICROSCOPE

BACKGROUND OF THE INVENTION

1. Field of the Invention

The present invention relates to electron microscopes and, more specifically, to an improved emitter assembly and a concentric beam passage arrangement for use in electron microscopes.

2. Prior Art

Electron microscopes require a relatively high vacuum in order to operate properly. The electron beam sources used to produce the beam cannot operate properly unless maintained in a relatively high vacuum. Atmospheric gas molecules within a gun assembly will be ionized by the electron beam and the liberated electrons and ions will flow to the anode and cathode, respectively. This may result in current instability as well as potentially severe and damaging arcing. Even at low concentrations, the acceleration of ions into the cathode results in a shortened operational life of the gun assembly. Consequently, a relatively high vacuum is required within the gun assembly to protect the emitter.

The electron beam can be scattered by the presence of molecules within the beam path. Consequently, to maintain a highly focused beam, such scattering must be minimized by maintaining a relatively high vacuum within the beam passage. Furthermore, the possibilities of system or sample contamination due to the polymerization of volatile contaminants require the presence of a vacuum for proper operation.

Several early electron microscopes simply placed the electromagnetic focusing elements within the vacuum region. This arrangement became undesirable due to heat conduction, outgasing and other problems associated with placing the electromagnetic focusing elements within the vacuum region. Another design employed inner walls within portions of the electromagnetic focusing elements to form an inner vacuum passage. This design resulted in a complex series of vacuum seals. In both of these prior art designs, the electromagnetic elements were intimately connected with the vacuum system. Consequently, cleaning procedures required disassembly of the entire optical column. Both of these arrangements held serious drawbacks for electron microscopes.

A significant innovation took place with the development of the column liner tube. A column liner tube is generally a conducting, nonmagnetic tube which is placed through the central apertures of the various electromagnetic lenses and deflecting elements. The column liner tube is evacuated to permit the passage of the electron beam. Spray baffles may be typically located within the column liner tube to obstruct the passage of stray electrons which are scattered from the walls of the tube. Furthermore, a beam shaping aperture may be mounted within the tube. The principal virtue of this construction is that the electromagnetic elements are now located on the outside of the vacuum region. This permits a simpler, more compact construction and greatly facilitates the cleaning of the electron column. The column liner tube is typically made to be removable to further facilitate the cleaning. The use of a removable column liner tube is used in a majority of modern electron microscopes, examples of which are shown in U.S. Pat. Nos. 3,787,696 and 3,927,321.

The column liner tube of the prior art places several requirements on the liner tube itself. First, the liner tube must be capable of forming a vacuum-tight seal with the remainder of the microscope system. Furthermore, it must be completely conductive and must accurately maintain the position of the spray baffles and beam shaping apertures which are supported within the tube. Additionally, it must be capable of easy disassembly for cleaning. These multiple requirements result in a liner tube which must be precisely manufactured and assembled and is somewhat delicate to handle. Furthermore, the mating vacuum sealing elements of the column assembly experience wear due to the removability of the column liner tube and must be periodically serviced to maintain the proper sealing engagement.

The emitter assembly of known thermionic electron microscopes consists of a heated cathode which is mounted immediately behind a bias conductive structure known as the grid in which a central orifice is provided through which the electrons are emitted. Heating of the cathode causes electrons to be ejected from the cathode surface via thermal emission. Due to the negative electric potential of the emitter assembly, these electrons are then accelerated toward an adjacent anode structure which is maintained at a ground potential. The electrons pass through the anode structure into the beam passage of the microscope. The kinetic energy to which the electrons are accelerated is equal to the electrical potential (i.e., the beam voltage) maintained between the cathode and the anode.

The cathode is commonly a length of thin tungsten wire which is held between two mounting poles which are embedded in an insulating base made of glass or ceramic. The filament wire is typically bent to form a sharp point at the central location from which the electrons will be emitted. A number of alternative cathode materials, for example single crystal lanthanum hexaboride ($LaB_6$) or cerium hexaboride ($CeB_6$), are commonly used in place of the filament wire. The cathode and the supporting structure are referred to as the filament. Certain electron beams require the operation of the cathode at elevated temperatures. Evaporation of the cathode takes place at these elevated temperatures, and eventually the cathode will break or be depleted, requiring replacement of the filament. Conventional electron microscopes using a tungsten wire cathode are generally designed to achieve a cathode life of twenty to eighty hours of operation. Because of this, replacement of the filament is a common operation in such electron microscopes.

The grid plays an important role in controlling and shaping the emissions of the electron source. The grid is operated at a negative potential relative to the cathode so as to suppress the emissions of the cathode except at the very tip of the cathode where the potential field of the anode intrudes through an orifice in the grid. Consequently, by adjusting the suppression voltage on the grid (i.e., the bias voltage) the emission from the cathode can be confined to the small region at the tip of the cathode. The grid opening and the anode create an electrostatic lens which focuses the emitted electrons into a source spot. This source spot, also known as the crossover image, is further modified by the subsequent electromagnetic lenses. The quality of the image obtained from an electron microscope is intrinsically dependent upon the compactness and intensity of the source spot.

In order to obtain an appropriate source spot, it is necessary for the components of the emitter to be properly configured. Specifically, the grid orifice must be closely spaced and symmetrical relative to the cathode tip. Conventional electron microscopes typically use a grid orifice of one to two millimeters in diameter with the cathode tip set back somewhat less than this diameter. There are several practical requirements for the design of an emitter assembly as a result. First, the distance from the tip of the cathode to the grid must be accurately established. Second, the grid orifice must be accurately centered over the tip of the cathode. Third, the thickness of the grid adjacent to the orifice must be sufficiently thin to avoid contact between the cathode and the grid. Finally, the grid orifice must be highly uniform, circular and free of rough edges or insulating contaminants.

Cathode material evaporated from the cathode during operation of the emitter assembly results in the deposit of cathode material on the interior surface of the emitter assembly. These deposits must be periodically removed. Removing these deposits is a time-consuming operation requiring skill and care since improper handling can damage the orifice region. Because of the critical role in defining the performance of the electron microscope and the practical requirements for the cleanability, accurate alignment and other requirements of the emitter assembly, the emitter assemblies of the prior art have consistently been designed as high precision machined assemblies typically fabricated from stainless steel. As a result, the prior art emitter assemblies have been rather expensive to manufacture.

Various emitter assembly designs are known in the prior art. Some electron microscopes have been constructed such that the filament is plugged directly into sockets located in the microscope itself with the grid placed over it. However, the majority of electron microscopes employ a cartridge system in which the filament is mounted in a removable assembly which includes the grid. The cartridge system is more convenient in that the entire assembly can be cleaned, reloaded and aligned away from the microscope. However, the cartridge system is more complex, principally due to the necessity of providing reliable mating electrical connections to the filament.

U.S. Pat. No. 3,857,055 discloses a cartridge type emitter assembly. The emitter assembly clamps a filament unit between a back plate and an extended flange of a cap member. Adjustments between the filament and a grid orifice are provided by movements of the filament base through a limited range of motion provided by gaps within the filament base. The difficulty with the cartridge system disclosed in U.S. Pat. No. 3,857,055 is that a specialized filament is required for the construction of the emitter assembly and the design of the individual pieces require a certain amount of machining. Consequently, the cost of this emitter assembly is somewhat prohibitive.

The object of the present invention is to provide an emitter assembly which permits the fabrication of precisely aligned filament and grid members without the requirement of close tolerance parts. Another object of the present invention is to overcome the drawbacks of the emitter assemblies of the prior art discussed above.

A further object of the present invention is to provide an improved column liner construction which results in reduced fabrication costs and simplified maintenance. A further object of the present invention is to overcome the drawbacks of the conventional column liner tube construction of the prior art.

SUMMARY OF THE INVENTION

The present invention provides an electron beam emitter assembly which includes a back plate, a front plate and clamping elements extending between the front plate and the back plate. A filament is clamped between the back plate and the front plate by the clamping elements. A grid is adjustably held against the front plate by the clamping elements whereby the grid may be adjustably positioned relative to the front plate and the filament.

In a preferred embodiment of the present invention, the clamping elements are a plurality of clamping screws which extend through holes in the front plate and are threadably received within threaded holes provided in the back plate. The grid may be formed as a flanged cap having a central orifice, wherein the plurality of clamping screws clamps against the flange of the grid to secure the grid into position.

It should be understood, of course, that other clamping systems may also be used to secure the grid and the plates together. Since one of the principal merits of the current invention is that the emitter assembly may be constructed of inexpensive elements and thus disposed after one use and also since adjustment of the grid orifice relative to the cathode tip needs to be performed only during initial assembly, the clamping system is not restricted to removable devices. In particular, the present invention lends itself to the use of bendable tabs, deformable rivets, spot welding or the like which might be employed as clamping means to secure the grid to the front plate, the front plate to the back plate, or the grid, front plate and back plate all together.

The filament includes a filament base, a pair of electrodes extending through the filament base and a cathode supported between the pair of electrodes. In a preferred embodiment of the present invention, the front plate includes a central opening through which the pair of electrodes and the cathode in the form of a filament wire extend. A recess is formed adjacent the central opening on one surface of the front plate. The front plate may have a diameter larger than the back plate to provide a surface for clamping the emitter assembly into position.

The present invention provides an electron microscope which includes a gun assembly having an emitter assembly therein for producing an electron beam. A column assembly is coupled to the gun assembly with electromagnetic lenses positioned within the column assembly for focusing, shaping and deflecting the electron beam. A beam passage is provided within the column assembly extending through a central portion of the electromagnetic lenses for forming an evacuated path for the electron beam. The beam passage includes an outer sealing jacket forming a seal with the column assembly sufficient to maintain a vacuum within the outer sealing jacket and a conductive inner liner tube positioned within the outer sealing jacket and adapted to have the electron beam pass therethrough. The inner liner tube supports beam modifying devices which affect the electron beam passing through the inner tube.

The beam modifying devices may include spray baffles and/or beam shaping apertures, The spray baffles may be formed as flaps of the inner liner tube which are bent in toward the interior of the inner liner tube. Additionally, the spray baffles may be formed as washer like discs which are held in position by crimping the inner liner tube. A plurality of openings may be provided within the inner liner tube extending through the inner liner tube such that the beam modifying devices are adapted to be inserted and removed from the openings.

Centering plugs received on opposed ends of the inner liner tube will position the inner liner tube within the outer sealing jacket and the column assembly. An anode is adapted to be positioned on top of the uppermost centering plug. The anode may be formed as a flanged cap substantially the same as the grid of the emitter assembly described above.

These and other advantages of the present invention will become apparent in the description of the preferred embodiment in connection with the attached drawings, wherein like reference numerals indicate like elements throughout.

BRIEF DESCRIPTION OF THE PREFERRED EMBODIMENT

Figure 1:
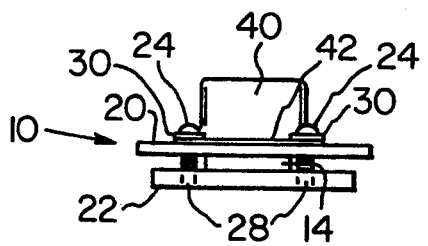
FIG. 1 illustrates an emitter assembly according to the present invention.
Figure 3:
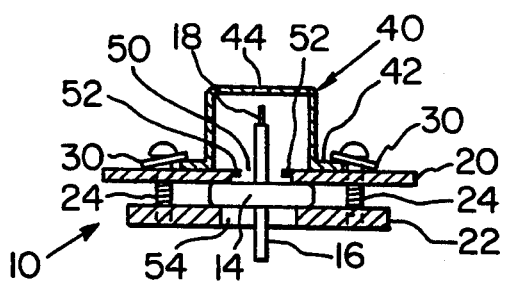
FIG. 3 is a sectional view of the emitter assembly of FIG. 1.
Figure 2:
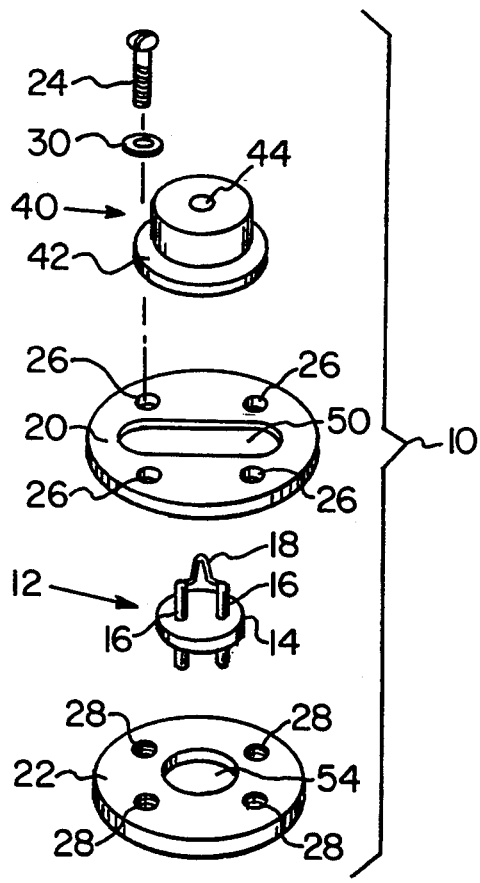
FIG. 2 illustrates an exploded view of the emitter assembly of FIG. 1.

FIGS. 1-3 illustrate an emitter assembly 10 according to the present invention. The emitter assembly 10 includes a filament 12 which is made up of a circular insulating filament base 14 made of a ceramic or glass wafer through which two mounting posts 16, or electrodes, extend. A filament wire 18 forms the cathode and extends between the mounting posts 16 and is typically bent to form a sharp point at a central location from which electrons will be emitted.

The filament base 14 is clamped between a front plate 20 and a back plate 22. Clamping screws 24 extend through holes 26 in the front plate 20 and are threadably received within threaded holes 28 formed within the back plate 22. The clamping screws 24 securely position the filament 12 between the front plate 20 and the back plate 22. Washers 30 may also be provided for the clamping screws 24.

A grid 40 is adjustably held against the front plate 20 by the clamping screws 24 securing against a flange 42 of the grid 40. The grid 40 includes a central orifice 44. The clamping screws 24 are positioned to permit the grid 40 to be moved radially over a small range before the clamping screws 24 are tightened.

Figure 4:
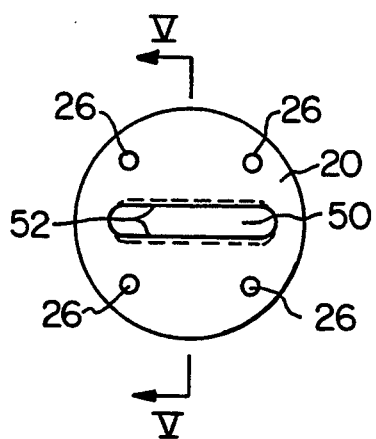
FIG. 4 is a top view of the top plate of the emitter assembly of FIG. 1.
Figure 5:
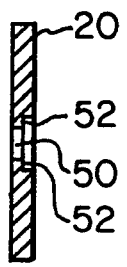
FIG. 5 is a sectional view of the top plate of FIG. 4.

The front plate 20 includes a central opening 50 through which the posts 16 and filament wire 18 extend. A recess 52, shown in FIGS. 3-5, is formed adjacent the central opening 50 on one surface of the front plate 20. The recess 52 prevents the deposit of metallic vapor from the filament wire 18 on the entire surface of the filament base 14 during use which could cause short circuits between the electrodes or posts 16 and the front plate 20.

The back plate 22 includes a central opening 54 through which the posts 16 extend to connect to sources of electrical power.

The central orifice 44 of the grid 40 can be aligned with the filament wire 18 by sliding the grid 40 to a position where the central orifice 44 is centered over the sharp point of the filament wire 18 prior to tightening of the clamping screws 24. Consequently, the accuracy of the alignment is only a function of the care taken in performing this centering operation and is not dependent on tolerances of the mating parts.

It is preferred that the front plate 20 be of a larger diameter than the back plate 22, providing a lip which can be held securely against a locating surface by a retaining ring which presses against the front surface of the lip, as will be described hereinafter. The front plate 20 and the back plate 22 may be provided with additional holes extending therethrough for location indexing and vacuum ventilation.

Height adjustment of the filament 12 can be achieved by adding shims between the filament base 14 and the front plate 20. Alternatively, height adjustments may be made by adjusting the thickness of the front plate 20 or by bossing or indenting the front plate 20.

A fundamental advantage of the emitter assembly 10 of the present design is the low fabrication costs which are achieved in part due to the elimination of critical tolerances. In the present design, only the thicknesses of the front plate 20 and the height of the grid 40 must be carefully controlled. The present design results in several significant reduced manufacturing steps. The grid 40 of the present design can be inexpensively stamped from a light gauge stainless steel. Electrodeposition may also be suitable. The key feature of the grid 40 of the present design is that it does not have to be machined. Due to the thinness of the grid 40, a large variety of conventional techniques are available for creating the central orifice 44 of the required shape and size. The central orifice 44 need not be located with great accuracy since it may be shifted into proper alignment.

The filament base 14 is an unmodified wafer type circular disc and the clamping screws 24 are positioned beyond the periphery of the disc. The filament base 14 does not incorporate any alignment features and does not need to be maintained to tight tolerances; therefore, a very inexpensive filament 12 may be utilized. The use of an inexpensive filament 12 increases the savings of the entire emitter assembly 10.

The front plate 20 and back plate 22 are effectively shielded from high field gradients present at the filament wire 18 and are thus not subject to electrical discharges or to charging effects which might influence the electron beam. Consequently, the front plate 20 and back plate 22 do not need to be manufactured with the same attention to surface condition and finish as in conventional emitter assemblies. The front plate 20 and the back plate 22 may be formed as simple metal discs with the appropriate holes. These discs may be cheaply fabricated by conventional machining technology or, preferably, may be punched or stamped at a lower cost. The front plate 20 and the back plate 22 can be satisfactorily manufactured from ordinary grades of aluminum or stainless steel.

The emitter assembly 10 according to the present invention is an inexpensive, disposable emitter assembly. After use, the emitter assembly 10 may be simply discarded or possibly recycled. Consequently, the exchange of the emitter assembly 10 is a quick and convenient operation. The emitter assembly 10 may be provided to the customer precleaned and prealigned resulting in consistent high performance regardless of the particular operator skill. The present design provides that the fragile filament 12 is well protected and is not readily damaged by careless handling. The compact and light design of the emitter assembly 10 makes it possible to achieve thermal equilibrium faster than more massive conventional emitter assemblies. The present design will axially clamp the filament base 14 into position. Therefore, the filament 12 is not subject to slippage or thermal drift since the filament 12 is not subject to radial forces, unlike screw adjusted filaments of the prior art. The present design of the emitter assembly 10 minimizes the opportunity for the trapping of gases within the assembly. These elements combine to make the emitter assembly 10 of the present invention a cost-effective solution to prior art problems.

Figure 6:
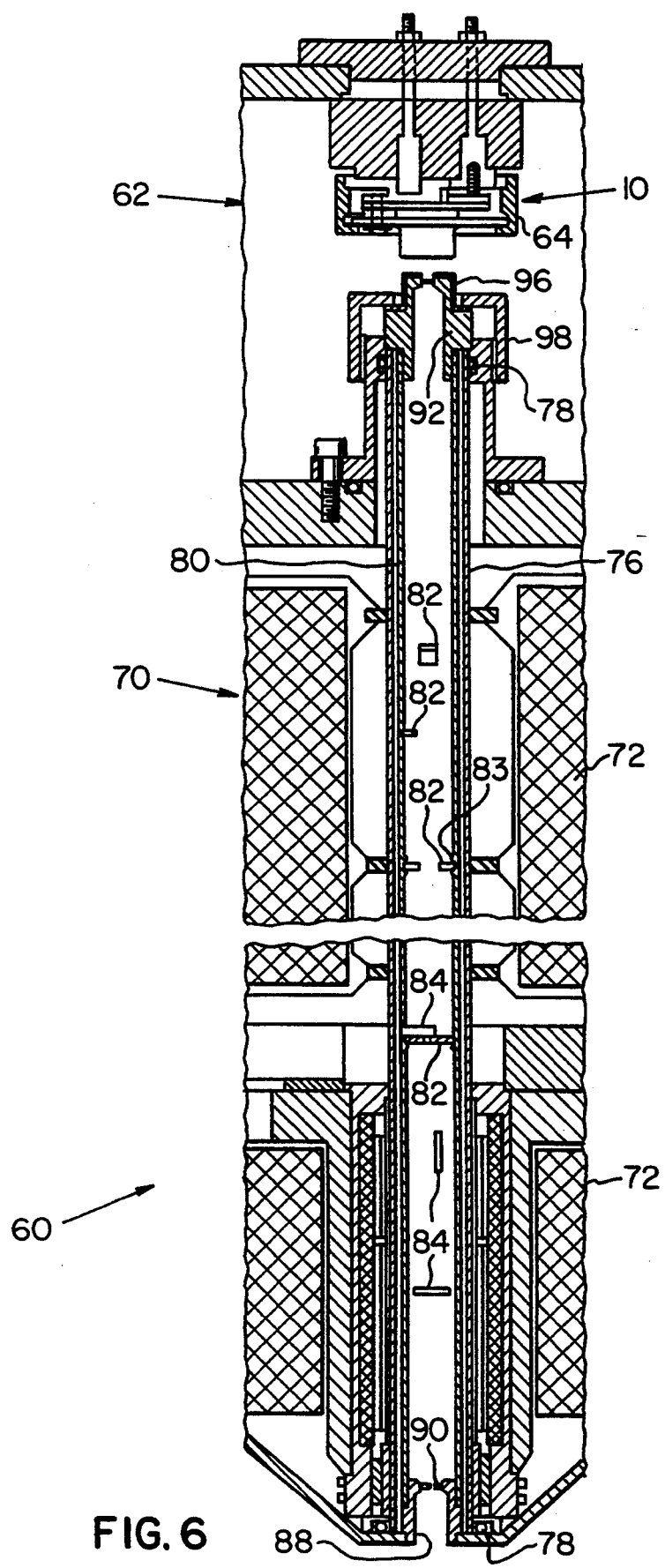
FIG. 6 illustrates the electron microscope of the present invention including the emitter assembly of FIG. 1.

FIG. 6 illustrates an electron microscope 60 according to the present invention. The electron microscope 60 includes a gun assembly 62 in which the emitter assembly 10 of the present invention may be mounted. The emitter assembly 10 is secured into position by a retaining ring 64 which engages against the front plate 20 of the emitter assembly 10.

A column assembly 70 is coupled to the gun assembly 62 with conventional electromagnetic lenses 72 positioned within the column assembly 70. An outer sealing jacket in the form of an outer liner tube 76 extends through a central portion of the electromagnetic lenses 72 for forming an evacuated passage for the electron beam. The outer liner tube 76 is sealed against the column assembly 70 through sealing O-rings 78 which are sufficient to maintain a vacuum within the outer liner tube 76.

A conductive inner liner tube 80 is positioned within the outer liner tube 76 and is adapted to have the electron beam pass therethrough.

The two concentric liner tubes 76 and 80 of the present invention require sufficient space between the liner tubes 76 and 80 to permit efficient evacuation.

The inner liner tube 80 includes spray baffles 82 which may be formed as flaps of the inner liner tube 80 which are bent in toward the interior of the inner liner tube 80. Additionally, the spray baffles 82 may be inexpensively formed as washer like discs which are positioned within the inner liner tube 80 by crimping the inner liner tube 80 to form positioning ridges 83. Slits or openings 84 may be provided in the inner liner tube 80 which extend the entire way through the inner liner tube 80. The slits or openings 84 can be designed to allow for spray baffles 82 to be inserted within the inner liner tube 80. Other auxiliary devices may be incorporated within the inner liner tube 80 and may also be inserted through slits or openings 84.

A lower centering plug 88 with a beam shaping aperture 90 is positioned in a lower end of the inner liner tube 80. The lower centering plug 88 includes a lower locating lip received in an exit bore of the final focusing or objective lens for proper centering of the inner liner tube 80. An upper centering plug 92 is received in an upper end of the inner liner tube 80 opposite the lower centering plug 88. An anode 96 is received on the top of the upper centering plug 92. The anode 96 can be conveniently formed to be substantially identical to the grid 40 of the emitter assembly 10 described above.

The anode 96 and the upper centering plug 92 are held into position by a retaining ring 98. The upper centering plug 92 and the lower centering plug 88 cooperate to properly align the inner liner tube 80 within the outer liner tube 76.

The present concentric liner tube construction results in reduced fabrication costs and simplified maintenance over the prior art designs. The outer liner tube 76 and the inner liner tube 80 perform separate functions. The outer liner tube 76 is sealed to the remainder of the electron optical system and provides the enclosure which is to be evacuated for the passage of the beam. The outer liner tube 76 does not require rigorous cleaning since the inner liner tube 80 shields it from affecting the passage of the electron beam. Consequently, the outer liner tube 76 may be permanently installed within the system with a corresponding improvement in simplicity of design and an increase in reliability of vacuum seals.

The inner liner tube 80 is a simple conductive tube which provides support for the spray baffles 82 and the beam shaping apertures 86. It should be understood, of course, that the outer sealing jacket and the inner liner tube 80 need not be specifically configured as tubes. For example, the outer sealing jacket may be formed by sealing together adjacent elements of the electron column. The central feature of these elements are that the electrically conductive inner liner tube 80 through which the beam passes, be substantially contained within a separate vacuum enclosure formed by the outer sealing jacket.

The inner liner tube 80 does not require vacuum seals. It may be formed of inexpensive, light gauge tubing which is manufactured to relatively loose tolerances. This reduction in the expense means that it is practical to consider the inner liner tube 80 to be a disposable element which can be inexpensively supplied to the microscope user in a precleaned form. The inner liner tube 80 may be simply replaced when it becomes sufficiently contaminated. This replacement reduces the maintenance effort required for the user, resulting in greater consistency and reliability of operation and minimizing the expense of downtime due to cleaning of the beam tube. Furthermore, since the inner liner tube 80 is not required to maintain a vacuum, there is no restriction against penetrations through the inner liner tube 80. Therefore, the slits or openings 84 and the spray baffles 82 may be positioned to control the beam spray. The slits 84 and other perforations in the inner liner tube 80 may be used to control the effects of magnetically induced eddy currents, particularly in the vicinity of the deflection coils of a scanning electron microscope. Also, the openings 84 may be arranged to permit the entry of beam modifying or detecting devices. The evacuation of the inner liner tube 80, which is conventionally inhibited by the presence of spray baffles, may be improved by the use of the penetrations in the walls of the inner liner tube 80. Additionally, it is anticipated that by judicious designs of baffles, inner liner tube penetrations and the diameters of the inner and outer liner tubes that the inner liner tube 80 may be differentially pumped so as to permit a high vacuum to be achieved near the source end with a relatively lower vacuum near the exit end of the optics. Further, since the inner liner tube does not need to be cleaned, the spray baffles may be installed by inexpensive, permanent means such as crimping.

From the foregoing description, it will be apparent to those of ordinary skill in the art that various modifications may be made to the disclosed invention without departing from the spirit and scope thereof. Accordingly, the scope of the present invention is only to be limited as necessitated by the accompanying claims.

What is claimed is:

1. An electron microscope comprising:
   a gun assembly producing an electron beam;
   a column assembly coupled to said gun assembly;
   an electromagnetic lens means positioned within said column assembly for focusing, shaping and deflecting said electron beam; and
   a beam passage means positioned within said column assembly extending through a central portion of said electromagnetic lens means for forming an evacuated path for said electron beam, said beam passage means including
   an outer sealing jacket forming a seal with said column assembly sufficient to maintain a vacuum within said outer sealing jacket, and
   a conductive inner liner tube positioned substantially within and spaced from said outer sealing jacket adapted to have said electron beam pass therethrough, said inner liner tube supporting beam modifying means for modifying said electron beam passing through said inner liner tube, wherein said space between said inner liner tube and said outer sealing jacket is sufficient to permit evacuation within said outer sealing jacket.

2. An electron microscope comprising:
   a gun assembly producing an electron beam, wherein said gun assembly includes an electron beam emitter assembly, said electron beam emitter assembly including
   a back plate;
   a front plate;
   clamping means extending between said front plate and said back plate;
   a filament means including a cathode means supported between a pair of electrodes, said electrodes supported by an insulating base, said insulating base being clamped between said back plate and said front plate by said clamping means;
   a grid adjustably held against said front plate by said clamping means, whereby said grid may be adjustably positioned relative to said front plate and said filament means;
   a column assembly coupled to said gun assembly;
   an electromagnetic lens means positioned within said column assembly for focusing, Shaping and deflecting said electron beam; and
   a beam passage means positioned within said column assembly extending through a central portion of said electromagnetic lens means for forming an evacuated path for said electron beam, said beam passage means including
   an outer sealing jacket forming a seal with said column assembly sufficient to maintain a vacuum within said outer sealing jacket, and
   a conductive inner liner tube positioned substantially within said outer sealing jacket adapted to have said electron beam pass therethrough, said inner liner tube supporting beam modifying means for modifying said electron beam passing through said inner liner tube.

3. The electron microscope of claim 2 wherein said clamping means comprises a plurality of clamping screws extending through holes in said front plate and threadably received within threaded holes within said back plate.

4. The electron microscope of claim 3 wherein said grid is a flanged cap having a central orifice therein, wherein said plurality of clamping screws clamps said flange of said grid to secure said grid in position.

5. The electron microscope of claim 2 wherein said insulating base is a circular disc and said clamping means extends between said front plate and said back plate beyond the periphery of said disc.

6. The electron microscope of claim 2 wherein said front plate has a diameter larger than said back plate.

7. The electron microscope of claim 6 wherein said gun assembly includes a retaining ring engaging said front plate to secure said emitter assembly into position.

8. The electron microscope of claim 1 wherein said beam modifying means includes at least one spray baffle.

9. The electron microscope of claim 8 wherein at least one of said spray baffles is positioned within the interior of said inner liner tube by crimping said inner liner tube.

10. The electron microscope of claim 1 wherein said beam modifying means includes at least one beam shaping aperture.

11. The electron microscope of claim 1 wherein at least one opening is provided within the side of said inner liner tube extending through said inner liner tube.

12. The electron microscope of claim 11 wherein said beam modifying means includes devices adapted to be inserted and removed from said inner liner tube through said at least one opening.

13. The electron microscope of claim 1 wherein said beam tube means further includes at least one centering plug received in one end of said inner liner tube to position said inner liner tube within said column assembly.

14. The electron microscope of claim 1 wherein a plug is received in an end of said inner liner tube adjacent said gun assembly and an anode is positioned on said plug.

15. An electron microscope comprising:
   a gun assembly producing an electron beam;
   a column assembly coupled to said gun assembly;
   an electromagnetic lens means positioned within said column assembly for focusing, shaping and deflecting said electron beam; and
   a removable beam tube assembly positioned within said column assembly extending through a central portion of said electromagnetic lens means for forming an evacuated path for said electron beam, said removable beam tube assembly including
   an anode means incorporated in an end of said removable beam tube assembly adjacent said gun assembly whereby said beam tube assembly may be removed as a single integrated unit including said anode means.

16. An electron beam emitter assembly comprising:
   a back plate;
   a front plate;
   clamping means extending between said front plate and said back plate;
   a filament means including a cathode means supported between a pair of electrodes, said electrodes supported by an insulating base, said insulating base being clamped between said back plate and said front plate by said clamping means; and
   a grid adjustably held against said front plate by said clamping means, whereby said grid may be adjustably positioned relative to said front plate and said filament means.

17. The electron beam emitter assembly of claim 16 wherein said clamping means comprises a plurality of clamping screws extending through holes in said front plate and threadably received within threaded holes positioned in said back plate.

18. The electron beam emitter assembly of claim 17 wherein said grid is a flanged cap having a central orifice therein, wherein said plurality of clamping screws clamps said flange of said grid to secure said grid into position.

19. The electron beam emitter assembly of claim 16 wherein said front plate includes a central opening through which said pair of electrodes and said cathode means extend and a recess formed adjacent said central opening on one surface of said front plate.

20. The electron beam emitter assembly of claim 16 wherein said front plate has a diameter larger than said back plate.

21. The electron beam emitter assembly of claim 16 wherein said insulating base is a circular disc and said clamping means extends between said front plate and said back plate beyond the periphery of said disc.

22. A method for fabricating an electron microscope emitter assembly which includes a grid member and at least one support member clamping a filament member into position, said method comprising the steps of:
stamping said grid member; and
stamping said support member.

23. The method of claim 22 further comprising the step of stamping an anode for use with said emitter assembly wherein said anode is substantially identical to said grid member.

24. A method for fabricating an electron microscope gun assembly comprising the steps of:
stamping an anode of said gun assembly; and
stamping a grid member of said gun assembly, wherein said anode is substantially identical to said grid member.

* * * * *